(12) United States Patent
Kato et al.

(10) Patent No.: US 9,645,494 B2
(45) Date of Patent: May 9, 2017

(54) RESIST UNDERLAYER FILM FORMING COMPOSITION CONTAINING LOW MOLECULAR WEIGHT DISSOLUTION ACCELERATOR

(75) Inventors: Masakazu Kato, Toyama (JP); Takahiro Hamada, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 393 days.

(21) Appl. No.: 12/448,130

(22) PCT Filed: Dec. 11, 2007

(86) PCT No.: PCT/JP2007/073860
§ 371 (c)(1),
(2), (4) Date: Nov. 19, 2009

(87) PCT Pub. No.: WO2008/072624
PCT Pub. Date: Jun. 19, 2008

(65) Prior Publication Data
US 2010/0075253 A1   Mar. 25, 2010

(30) Foreign Application Priority Data
Dec. 13, 2006 (JP) .................. 2006-335723

(51) Int. Cl.
| | | |
|---|---|---|
| *G03F 7/09* | (2006.01) | |
| *G03F 7/039* | (2006.01) | |
| *G03F 7/30* | (2006.01) | |
| *G03F 7/32* | (2006.01) | |
| *H01L 21/027* | (2006.01) | |

(52) U.S. Cl.
CPC .............. *G03F 7/091* (2013.01); *G03F 7/039* (2013.01); *G03F 7/0392* (2013.01); *G03F 7/30* (2013.01); *G03F 7/322* (2013.01); *H01L 21/0276* (2013.01)

(58) Field of Classification Search
None
See application file for complete search history.

(56) References Cited

U.S. PATENT DOCUMENTS

| | | | |
|---|---|---|---|
| 5,702,872 A | * | 12/1997 | Imai et al. ................ 430/326 |
| 6,156,479 A | | 12/2000 | Meador et al. |
| 2008/0138744 A1 | * | 6/2008 | Hatanaka et al. ......... 430/319 |

FOREIGN PATENT DOCUMENTS

| | | | |
|---|---|---|---|
| JP | 9-62006 | * | 3/1997 |
| JP | A-2004-054286 | | 2/2004 |
| JP | A-2005-070154 | | 3/2005 |
| JP | 2006-285075 | * | 10/2006 |
| WO | WO 2005/093513 A2 | | 10/2005 |
| WO | WO 2005/111719 A2 | | 11/2005 |
| WO | WO 2005/111724 A1 | | 11/2005 |

OTHER PUBLICATIONS

JPO English abstract for JP 9-62006 (1997).*
Machine-assisted English translation of JP 9-62006 (1997).*
Derwent English abstract for JP2006-285075 (2006).*
Machine assisted English translation of JP2006-285075, as provided by JPO (2006).*
Derwent English abstract for JP 9-62006 (1997).*

* cited by examiner

*Primary Examiner* — Sin Lee
(74) *Attorney, Agent, or Firm* — Oliff PLC

(57) ABSTRACT

There is provided a resist underlayer film forming composition that is used in a lithography process for the production of semiconductor devices and that can be developed with an alkaline developer for photoresists, and a method of forming a photoresist pattern by using the resist underlayer film forming composition. The resist underlayer film forming composition used in a lithography process for a production of a semiconductor device comprising: an alkali-soluble resin (a); a polynuclear phenol (b); a compound (c) having at least two vinylether groups; and a photoacid generator (d). The alkali-soluble resin (a) may be a polymer containing a unit structure having a carboxyl group, and the polynuclear phenol (b) may be a compound having 2 to 30 phenolic hydroxyl groups in the molecule.

5 Claims, No Drawings

RESIST UNDERLAYER FILM FORMING COMPOSITION CONTAINING LOW MOLECULAR WEIGHT DISSOLUTION ACCELERATOR

TECHNICAL FIELD

The present invention relates to a resist underlayer film forming composition used in a lithography process for the production of semiconductor devices, and a method of producing semiconductor devices using the resist underlayer film.

BACKGROUND ART

In the production of a semiconductor device, fine processing by lithography using a photoresist has been performed. The fine processing is a processing method for forming fine convexoconcave corresponding to the following pattern on the surface of a substrate by: forming a thin film of a photoresist on a semiconductor substrate, such as a silicon wafer; irradiating an activating light ray, such as an ultra violet ray onto the resultant thin film through a mask pattern in which a pattern of a device is depicted to develop the film; and subjecting the substrate to etching processing using the resultant photoresist pattern as a protective film. Recently, however, the high integration of devices is progressed and the exposure light adopted tends to have a shorter wavelength, such as from a KrF excimer laser (wavelength: 248 nm) to an ArF excimer laser (wavelength: 193 nm). However, in these photolithography processes, due to the influence of a standing wave caused by the reflection of exposure light from the substrate or the influence of the diffuse reflection of exposure light caused by unevenness of the substrate, there is caused such a problem that the dimensional accuracy of a photoresist pattern is lowered. Thus, in order to solve this problem, a method of providing an antireflective film (bottom antireflective coating, BARC) between the photoresist and the substrate is widely studied.

Such an antireflective film is frequently formed using a heating-crosslinkable composition for preventing an intermixing with a photoresist coated on the antireflective film. As a result, the formed antireflective film becomes insoluble in an alkaline developer used for developing a photoresist. Therefore, the removal of the antireflective film prior to semiconductor substrate processing is necessary to be performed by dry etching (for example, see Patent Document 1).

However, at the same time with the removal of the antireflective film by dry etching, the photoresist is also removed by the dry etching. Therefore, there is caused a problem that the film thickness of the photoresist necessary for the substrate processing becomes harder to be secured. Particularly when a photoresist of a thin film is used for the purpose of enhancing the resolution, the problem becomes critical.

In addition, an ion implantation process in the production of semiconductor devices is a process for introducing impurities into a semiconductor substrate using a photoresist pattern as a mold. Then, in the process, for preventing the surface of a substrate from being damaged, a dry-etching process cannot be performed in the formation of a photoresist pattern. Therefore, in the formation of a photoresist pattern for an ion implantation process, an antireflective film requiring the removal thereof by dry etching cannot be used as an underlayer of the photoresist. Hitherto, a photoresist pattern used as a mold in an ion implantation process has a large line width of the pattern and was consequently seldom influenced by a standing wave caused by the reflection of exposure light from a substrate or by the diffuse reflection of exposure light due to unevenness of a substrate, so that by using a photoresist containing a dye or using an antireflective film as an upper layer of the photoresist, the problem of the reflection has been solved. However, following the miniaturization of the pattern in recent years, a fine pattern has started to be required also for a photoresist used in an ion implantation process and an antireflective film as a photoresist underlayer has become necessary.

From such a fact, it has been desired to develop an antireflective film capable of being dissolved in an alkaline developer used in the development of the photoresist and of being developed and removed together with the photoresist. Then, also conventionally, the antireflective film capable of being developed and removed together with the photoresist has been investigated (for example, see Patent Document 2, Patent Document 3, Patent Document 4, Patent Document 5, and Patent Document 6). However, such antireflective films are not satisfactory in terms of applicability to fine processing, the shape of a pattern to be formed etc.

[Patent Document 1]
U.S. Pat. No. 6,156,479
[Patent Document 2]
Japanese Patent Application Publication No. JP-A-2004-54286
[Patent Document 3]
Japanese Patent Application Publication No. JP-A-2005-70154
[Patent Document 4]
WO 05/093513 pamphlet
[Patent Document 5]
WO 05/111719 pamphlet
[Patent Document 6]
WO 05/111724 pamphlet

DISCLOSURE OF THE INVENTION

Problems to be Solved by the Invention

In view of the above-described disadvantages, it is an object of the present invention to provide a composition for forming a resist underlayer film soluble in an alkaline developer.

In other words, it is an object of the present invention to provide a resist underlayer film forming composition used in the production of semiconductor devices, specifically, to provide a resist underlayer film forming composition for forming a resist underlayer film causing no intermixing with a photoresist applied and formed as an upper layer of the resist underlayer film and capable of being dissolved in an alkaline developer and of being developed and removed together with the photoresist.

Means for Solving the Problems

The present invention provides, according to a first aspect, a resist underlayer film forming composition used in a lithography process for the production of a semiconductor device containing an alkali-soluble resin (a), a polynuclear phenol (b), a compound (c) having at least two vinylether groups, and a photoacid generator (d);

according to a second aspect, in the resist underlayer film forming composition according to the first aspect, the alkali-soluble resin (a) is a polymer containing a unit structure having a carboxyl group;

according to a third aspect, in the resist underlayer film forming composition according to the first aspect or the second aspect, the polynuclear phenol (b) is a compound having in one molecule thereof, 2 to 30 phenolic hydroxyl groups;

according to a fourth aspect, in the resist underlayer film forming composition according to any one of the first aspect to the third aspect, the polynuclear phenol (13) is a compound having in one molecule thereof, 2 to 10 phenol groups;

according to a fifth aspect, in the resist underlayer film forming composition according to any one of the first aspect to the fourth aspect, the polynuclear phenol (b) is a compound represented by Formula (b1-1);

[Chemical Formula 1]

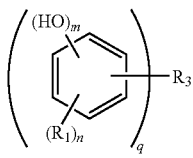

Formula (b1-1)

(where each $R_1$ is a substituent for a hydrogen atom of a benzene ring and represents a group selected from a group consisting of a hydroxy group, a halogen atom, an alkyl group having 1 to 10 carbon atom, an aryl group having 6 to 18 carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 2 to 10 carbon atoms, an alkoxy group having 1 to 6 carbon atom and a combination of these substituents; $R_3$ represents a single bond or a divalent to tetravalent alkylene group having 1 to 10 carbon atom or arylalkylene group having 6 to 25 carbon atoms; m is an integer of 1 to 5; n represents an integer satisfying $0 \le n \le 5-m$; and q represents an integer of 2 to 4), a compound represented by Formula (b1-2):

[Chemical Formula 2]

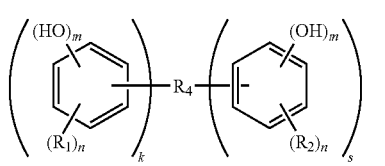

Formula (b1-2)

(where $R_1$ and $R_2$ are the same as or different from each other and individually represent the same meaning as $R_1$ defined in Formula (b1-1); $R_4$ represents a single bond or a divalent to hexavalent alkylene group having 1 to 10 carbon atom or arylalkylene group having 6 to 25 carbon atoms; m represents an integer of 1 to 5; n represents an integer satisfying $0 \le n \le 5-m$; and k and s individually represent an integer of 1 to 3), a compound represented by Formula (b1-3):

[Chemical Formula 3]

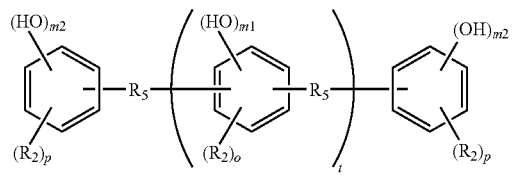

Formula (b1-3)

(where $R_1$ and $R_2$ are the same as or different from each other and individually represent the same meaning as $R_1$ defined in Formula (b1-1); $R_5$ represents a single bond or a divalent alkylene group having 1 to 10 carbon atom or arylalkylene group having 6 to 25 carbon atoms; m1 represents an integer of 1 to 4; m2 represents an integer of 1 to 5; o is a number satisfying $0 \le o \le 4-m1$; p is a number satisfying $0 \le p \le 5-m2$; and t represents an integer of 1 to 4), or a combination of these compounds;

according to a sixth aspect, in the resist underlayer film forming composition according to any one of the first aspect to the fifth aspect, the compound (c) having at least two vinylether groups is represented by Formula (c1):

[Chemical Formula 4]

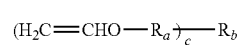

Formula (c1)

(where $R_a$ represents a divalent organic group selected from a group consisting of an alkyl group having 1 to 10 carbon atom, an aryl group having 6 to 18 carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms and an aryloxyalkyl group having 2 to 10 carbon atoms; $R_b$ represents a divalent to tetravalent organic group derived from an alkyl group having 1 to 10 carbon atom or an aryl group having 6 to 18 carbon atoms; and c represents an integer of 2 to 4);

according to a seventh aspect, a method of forming a photoresist pattern used in the production of a semiconductor includes: applying the resist underlayer film forming composition as described in any one of the first aspect to the sixth aspect on a semiconductor substrate; and calcining the composition to form a resist underlayer film;

according to an eighth aspect, a method of manufacturing a semiconductor device includes: forming a resist underlayer film by using the resist underlayer film forming composition as described in any one of the first aspect to the sixth aspect on a semiconductor substrate; forming a resist film on the resist underlayer film; and exposing the resist film to light and developing the resist film to form a resist pattern; and according to a ninth aspect, in the method of manufacturing a semiconductor device according to the eighth aspect, an exposed part of the resist underlayer film used exhibits alkali-solubility and an exposed part of the resist film and an exposed part of the resist underlayer film are removed at the same time by development using an alkaline developer to form the resist pattern on the semiconductor substrate.

Effects of the Invention

The resist underlayer film forming composition used in the present invention contains an alkali-soluble resin containing a unit structure having a carboxyl group, a polynuclear phenol, a compound having at least two vinylether groups and a photoacid generator, which are dissolved in a solvent. After the resist underlayer film forming composition is applied on a semiconductor substrate, it is calcined at a temperature at which a solvent is removed and then is thermally crosslinked by further calcination. The thermal crosslinking is formed by forming an acetal bond or a bond similar thereto between a carboxyl group in the alkali-soluble resin, a hydroxyl group in the polynuclear phenol, and a vinylether group-containing compound. A reaction between the carboxyl group in the alkali-soluble resin and the vinylether group-containing compound generates bonds of one ethereal oxygen atom and one esteric oxygen atom to the same carbon atom, and a reaction between the hydroxy group in the polynuclear phenol and the vinylether group-containing compound generates bonds of two ethereal oxygen atoms to the same carbon atom. Each of the carbon-oxygen bonds generated by the above reactions is easily broken by an acid (an acid generated from a photoacid generator (d) during the exposure) and is decomposed into a carboxyl group or a hydroxy group.

Accordingly, in the part exposed to light through a photomask, the acetal bond or a bond similar thereto is broken by an acid generated by decomposition of a photoacid generator to generate a carboxyl group or a hydroxyl group, so that the part exhibits alkali-solubility (solubility in a developer). In other words, a bond generated between an alkali-soluble resin (a) and a compound (c) having a vinylether group is broken to generate a carboxylic acid and to exhibit alkali-solubility. In addition, a bond generated between a polynuclear phenol (b) and the compound (c) having a vinylether group is broken to generate a phenol and to exhibit alkali-solubility.

In the present invention, since the acetal bond or a bond similar thereto between an alkali-soluble resin (a) and a polynuclear phenol (b), and a compound (c) having at least two vinylether groups is generated in a large number in a resist underlayer film, even when the exposure is performed using fine patterns and thereafter the development is performed, there are many sites in which a bond is broken and many phenolic hydroxyl groups are regenerated, so that fine patterns can be produced and the resolution can be enhanced.

BEST MODES FOR CARRYING OUT THE INVENTION

The resist underlayer film forming composition used in a lithography process for the production of a semiconductor device according to the present invention contains an alkali-soluble resin (a), a polynuclear phenol (b), a compound (c) having at least two vinylether groups and a photoacid generator (d), which are dissolved in a solvent and further contains optional components such as a surfactant.

The total solid content after removal of the solvent from the resist composition is 0.1 to 70% by mass, preferably 1 to 60% by mass.

In addition, the content of the alkali-soluble resin (a) in the solid content of the resist underlayer film forming composition is 10% by mass or more, for example 30 to 99% by mass, for example 49 to 90% by mass, for example 59 to 80% by mass.

The alkali-soluble resin (a) used in the present invention has a weight average molecular mass of 100 to 1,000,000, preferably 1,000 to 200,000.

The alkali-soluble resin (a) contains a unit structure containing a carboxyl group as an essential structure. The unit structure containing a carboxyl group is derived from the polymerization of acrylic acid or methacrylic acid. In addition, a form of a carboxyl group substituted in an aromatic ring can also be used. The alkali-soluble resin (a) may be a copolymer containing a unit structure other than the unit structure containing a carboxyl group.

The content of the unit structure containing a carboxyl group in the alkali-soluble resin (a) is, when all repeating units contained in the resin are assumed to be 1.0, 0.05 to 0.80, preferably 0.10 to 0.60.

The above other unit structures contained in the alkali-soluble resin (a) can be introduced into a polymer by using polymerizable compounds such as acrylate ester compounds, methacrylate ester compounds, maleimide compounds, acrylonitrile, maleic anhydride compounds, imide compounds, styrene compounds and vinyl compounds.

Examples of the acrylic ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, tert-butyl acrylate, cyclohexyl acrylate, isobornyl acrylate, 2-methoxyethyl acrylate, methoxytriethylene glycol acrylate, mono-(2-(acryloyloxy)ethyl)phthalate, 2-ethoxyethyl acrylate, tetrahydrofurfuryl acrylate, 3-methoxybutyl acrylate, 3-hydroxyadamantyl acrylate, 2-methyl-2-adamantyl acrylate, 2-propyl-2-adamantyl acrylate, 8-methyl-8-tricyclodecyl acrylate, 8-ethyl-8-tricyclodecyl acrylate and 5-acryloyloxy-6-hydroxynorbornene-2-carboxylic-6-lactone.

Examples of the methacrylic ester compound include methyl methacrylate, ethyl methacrylate, isopropyl methacrylate, benzyl methacrylate, naphthyl methacrylate, anthryl methacrylate, anthrylmethyl methacrylate, phenyl methacrylate, 2-hydroxyethyl methacrylate, 2-hydroxypropyl methacrylate, 2,2,2-trifluoroethyl methacrylate, tart-butyl methacrylate, cyclohexyl methacrylate, isobornyl methacrylate, 2-methoxyethyl methacrylate, methoxytriethylene glycol methacrylate, mono-(2-(methacryloyloxy)ethyl)phthalate, 2-ethoxyethyl methacrylate, tetrahydrofurfuryl methacrylate, 3-methoxybutyl methacrylate, 3-hydroxyadamantyl methacrylate, 2-methyl-2-adamantyl methacrylate, 2-propyl-2-adamantyl methacrylate, 8-methyl-8-tricyclodecyl methacrylate, 8-ethyl-8-tricyclodecyl methacrylate and 5-methacryloyloxy-6-hydroxynorbornene-2-carboxylic-6-lactone.

Examples of the vinyl compound include vinyl ether, methyl vinyl ether, benzyl vinyl ether, 2-hydroxyethyl vinyl ether, phenyl vinyl ether and propyl vinyl ether.

Examples of the styrene compound include styrene, methylstyrene, chlorostyrene, bromostyrene, t-butoxystyrene and hydroxystyrene.

Examples of the maleimide compound include maleimide, N-methylmaleimide, N-phenylmaleimide and N-cyclohexylmaleimide.

The imide compound is obtained by, for example a reaction between phthalic dianhydride or cyclobutanetetracarboxylic dianhydride and diamino benzene.

The polynuclear phenol (b) used in the present invention is a compound having in one molecule thereof, 2 to 30 phenolic hydroxyl groups. In addition, the polynuclear phenol (b) is a compound having in one molecule thereof, 2 to 10 phenol groups. In other words, several phenolic hydroxyl groups can be contained in the benzene ring thereof.

The polynuclear phenol (b) used in the present invention has a phenol group and the phenol group has at least one phenolic hydroxyl group. The polynuclear phenol used in the present invention can be constituted either of a part having a phenol group or of a combination of a part having a phenol group and a part other than a phenol group.

The polynuclear phenol (b) used in the present invention is a compound represented by Formula (b1-1), a compound represented by Formula (b1-2), a compound represented by Formula (b1-3) or a combination of these compounds.

In Formula (b1-1), each $R_1$ is a substituent for a hydrogen atom of the benzene ring and represents a group selected from a group consisting of a hydroxy group, a halogen atom, an alkyl group having 1 to 10 carbon atom(s), an aryl group having 6 to 18 carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 2 to 10 carbon atoms, an alkoxy group having 1 to 6 carbon atom(s), and a combination thereof; $R_3$ represents a single bond or a divalent to tetravalent alkylene group having 1 to 10 carbon atom(s) or arylalkylene group having 6 to 25 carbon atoms; m represents an integer of 1 to 5; n represents an integer satisfying $0 \leq n \leq 5-m$; and q represents an integer of 2 to 4.

Examples of the halogen atom include a fluorine atom, a chlorine atom, a bromine atom and an iodine atom.

Examples of the alkyl group include a methyl group, an ethyl group, an n-propyl group, an isopropyl group, an octyl group, a nonyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, 2,3-dimethyl-n-butyl, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group. Particularly, a straight chain alkyl group such as a methyl group and an ethyl group, a cyclohexyl group, or the like is preferred.

Examples of the aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

Examples of the arylalkyl group include a benzyl group, an o-methylbenzyl group, an m-methylbenzyl group, a p-methylbenzyl group, an o-chlorobenzyl group, an m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenetyl group, an o-methylphenetyl group, an m-methylphenetyl group, a p-methylphenetyl group, an o-chlorophenetyl group, an m-chlorophenetyl group, a p-chlorophenetyl group, an o-fluorophenetyl group, a p-fluorophenetyl group, an o-methoxyphenetyl group, a p-methoxyphenetyl group, a p-nitrophenetyl group, a p-cyanophenetyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, an m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-phenanthrylmethyl group, a 9-phenanthrylmethyl group, an α-naphthylethyl group, a β-naphthylethyl group, an o-biphenylylethyl group, an m-biphenylylethyl group, a p-biphenylylethyl group, a 1-anthrylethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group and a 9-phenanthrylethyl group.

Examples of the alkylcarbonyl group include a methylcarbonyl group, an ethylcarbonyl group, an n-propylcarbonyl group, an isopropylcarbonyl group, a cyclopropylcarbonyl group, an n-butylcarbonyl group, an i-butylcarbonyl group, an s-butylcarbonyl group, a t-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butylcarbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2- methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group and a 2-ethyl-3-methyl-cyclopropylcarbonyl group.

Examples of the alkylcarbonyloxy group include a methylcarbonyloxy group, an ethylcarbonyloxy group, an n-propylcarbonyloxy group, an isopropylcarbonyloxy group, a cyclopropylcarbonyloxy group, an n-butylcarbonyloxy group, an i-butylcarbonyloxy group, an s-butylcarbonyloxy group, a t-butylcarbonyloxy group, a cyclobutylcarbonyloxy group, a 1-methyl-cyclopropylcarbonyloxy group, a 2-methyl-cyclopropylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a cyclopentylcarbonyloxy group, a 1-methyl-cyclobutylcarbonyloxy group, a 2-methyl-cyclobutylcarbonyloxy group, a 3-methyl-cyclobutylcarbonyloxy group, a 1,2-dimethyl-cyclopropylcarbonyloxy group, a 2,3-dimethyl-cyclopropylcarbonyloxy group, a 1-ethyl-cyclopropylcarbonyloxy group, a 2-ethyl-cyclopropylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butyl carbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a cyclohexylcarbonyloxy group, a 1-methyl-cyclopentylcarbonyloxy group, a 2-methyl-cyclopentylcarbonyloxy group, a 3-methyl-cyclopentylcarbonyloxy group, a 1-ethyl-cyclobutylcarbonyloxy group, a 2-ethyl-cyclobutylcarbonyloxy group, a 3-ethyl-cyclobutylcarbonyloxy group, a 1,2-dimethyl-cyclobutylcarbonyloxy group, a 1,3-dimethyl-cyclobutylcarbonyloxy group, a 2,2-dimethyl-cyclobutylcarbonyloxy group, a 2,3-dimethyl-cyclobutylcarbonyloxy group, a 2,4-dimethyl-cyclobutylcarbonyloxy group, a 3,3-dimethyl-cyclobutylcarbonyloxy group, a 1-n-propyl-cyclopropylcarbonyloxy group, a 2-n-propyl-cyclopropylcarbonyloxy group, a 1-isopropyl-cyclopropylcarbonyloxy group, a 2-isopropyl-cyclopropylcarbonyloxy group, a 1,2,2-trimethyl-cyclopropylcarbonyloxy group, a 1,2,3-trimethyl-cyclopropylcarbonyloxy group, a 2,2,3-trimethyl-cyclopropylcarbonyloxy group, a 1-ethyl-2-methyl-cyclopropylcarbonyloxy group, a 2-ethyl-1-methyl-cyclopropylcarbonyloxy group, a 2-ethyl-2-methyl-cyclopropylcarbonyloxy group and a 2-ethyl-3-methyl-cyclopropylcarbonyloxy group.

Examples of the alkylcarbonylamino group include a methylcarbonylamino group, an ethylcarbonylamino group, an n-propylcarbonylamino group, an isopropylcarbonylamino group, a cyclopropylcarbonylamino group, an n-butylcarbonylamino group, an i-butylcarbonylamino group, an s-butylcarbonylamino group, a t-butylcarbonylamino group, a cyclobutylcarbonylamino group, a 1-methyl-cyclopropylcarbonylamino group, a 2-methyl-cyclopropylcarbonylamino group, an n-pentylcarbonylamino group, a 1-methyl-n-butylcarbonylamino group, a 2-methyl-n-butylcarbonylamino group, a 3-methyl-n-butylcarbonylamino group, a 1,1-dimethyl-n-propylcarbonylamino group and a 1,2-dimethyl-n-propylcarbonylamino group.

Examples of the aryloxyalkyl group include a phenyloxymethyl group, an o-methylphenyloxyethyl group, an m-methylphenyloxymethyl group, a p-methylphenyloxypropyl group, an o-chlorophenyloxymethyl group, an m-chlorophenyloxyethyl group, a p-chlorophenyloxyisopropyl group, an o-fluorophenyloxyethyl group, a p-fluorophenyloxybutoxy group, an o-methoxyphenyloxy-n-pentyl group, a p-methoxyphenyloxy-t-butyl group, a p-nitrophenyloxymethyl group, a p-cyanophenyloxy-s-butyl group, an α-naphthyloxymethyl group, a β-naphthyloxyethyl group, an o-biphenylyloxymethyl group, an m-biphenylyloxymethyl group, a p-biphenylyloxymethyl group, a 1-anthryloxymethyl group, a 2-anthryloxymethyl group, a 9-anthryloxymethyl group, a 1-phenantbhryloxymethyl group, a 2-phenanthryloxymethyl group, a 3-phenanthryloxymethyl group, a 4-phenanthryloxymethyl group and a 9-phenanthryloxymethyl group.

Examples of the alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group and a 1-ethyl-2-methyl-n-propoxy group.

Examples of the compound represented by Formula (b1-1) include as follows.

[Chemical Formula 5]

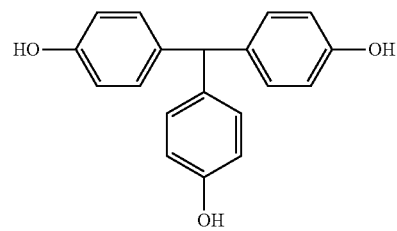

(b1-1-1)

(b1-1-2)
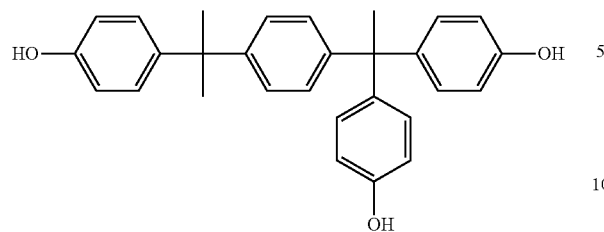
(b1-1-3)
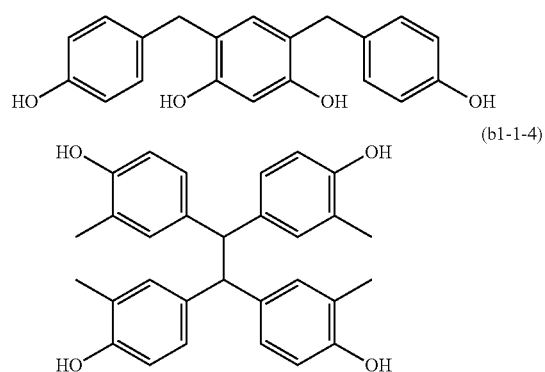
(b1-1-4)
(b1-1-5)
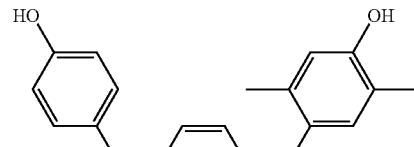
(b1-1-6)
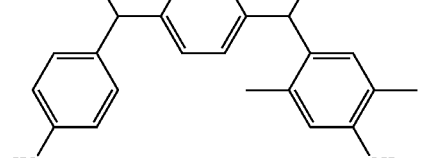
(b1-1-7)
(b1-1-8)
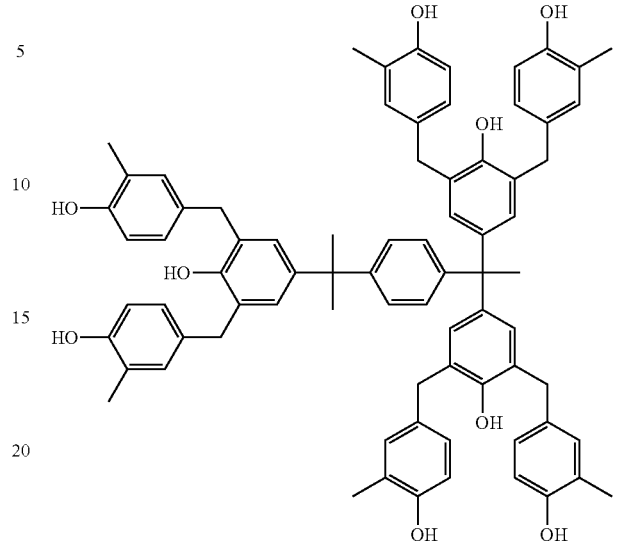
[Chemical Formula 6]
(b1-1-9)
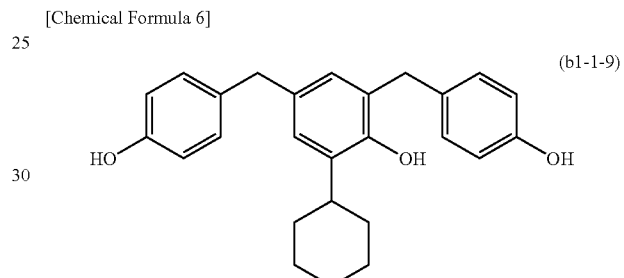
(b1-1-10)
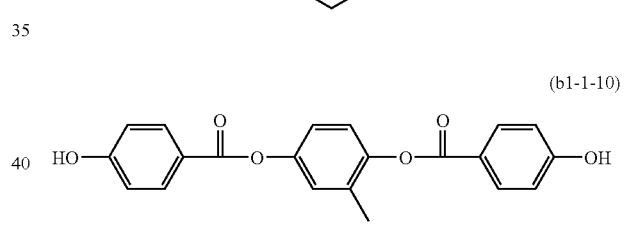
(b1-1-11)
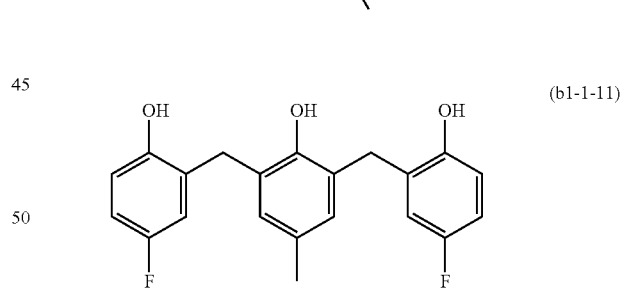
(b1-1-12)
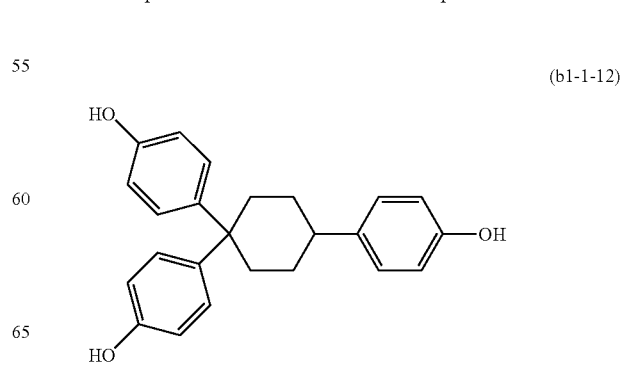

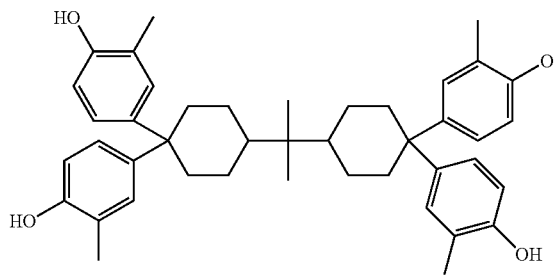
(b1-1-13)

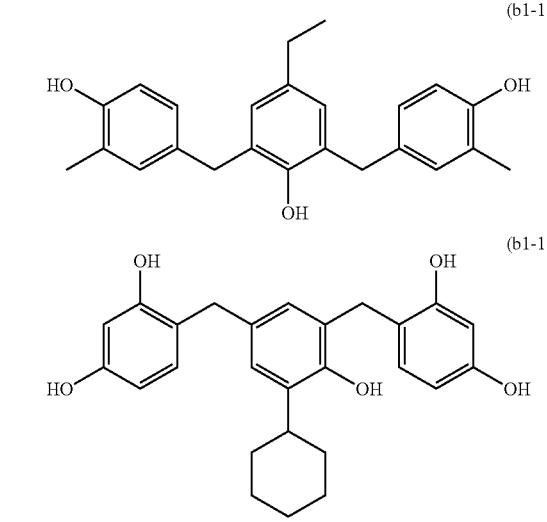
(b1-1-14)
(b1-1-15)

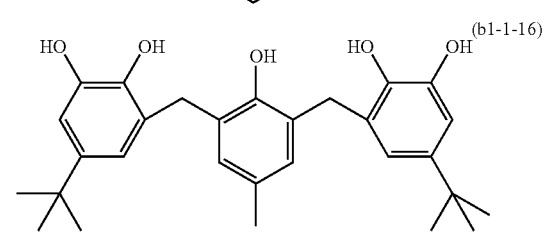
(b1-1-16)

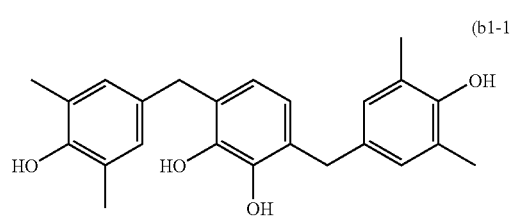
(b1-1-17)

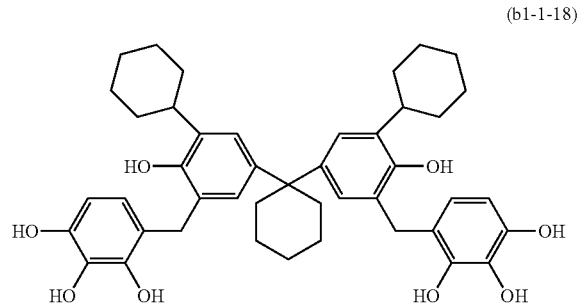
(b1-1-18)

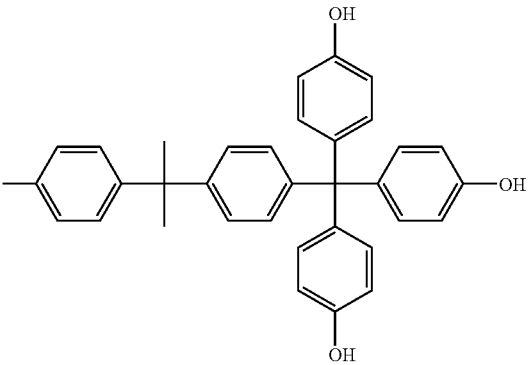
(b1-1-19)

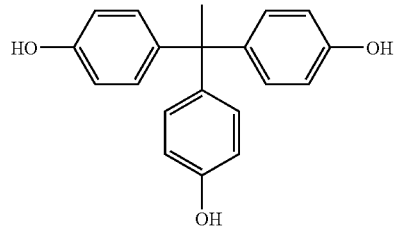
(b1-1-20)

$R_1$ and $R_2$ in Formula (b1-2) are the same as or different from each other and individually represent the same meaning as $R_1$ defined in Formula (b1-0.1); $R_4$ represents a single bond or a divalent to hexavalent alkylene group having 1 to 10 carbon atom(s) or arylalkylene group having 6 to 25 carbon atoms; m represents an integer of 1 to 5; n represents an integer satisfying $0 \leq n \leq 5-m$; and k and s individually represent an integer of 1 to 3.

Examples of the compound represented by Formula (b1-2) include the following compounds.

[Chemical Formula 7]

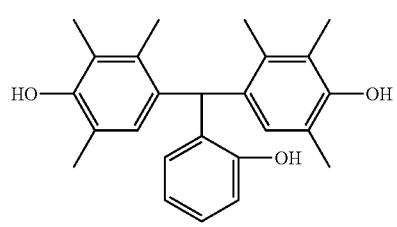
(b1-2-1)

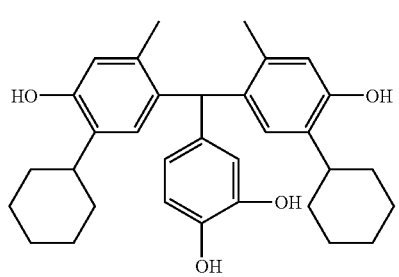
(b1-2-2)

-continued (b1-2-3)
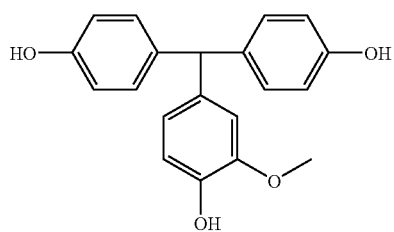

(b1-2-4)
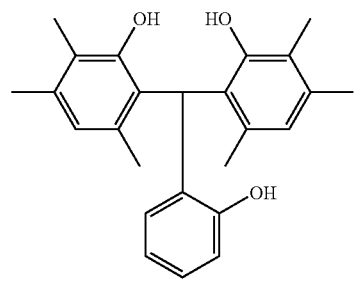

(b1-2-5)
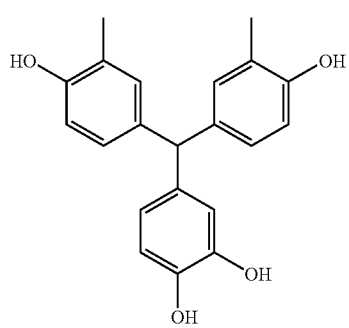

(b1-2-6)
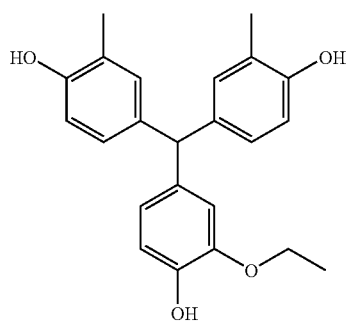

(b1-2-7)
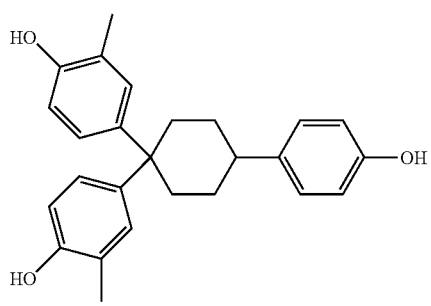

-continued (b1-2-8)
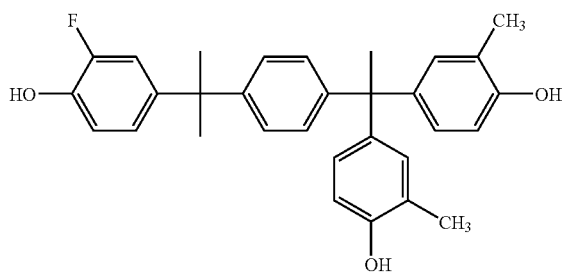

(b1-2-9)
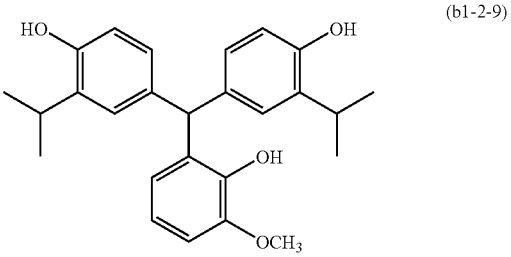

(b1-2-10)
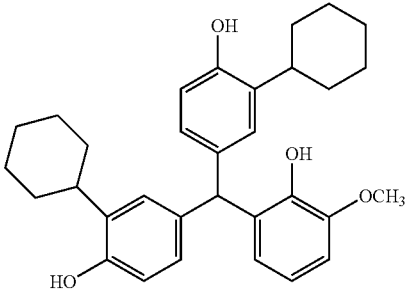

$R_1$ and $R_2$ in Formula (b1-3) are the same as or different from each other and individually represent the same meaning as $R_1$ defined in Formula (b1-1); $R_5$ represents a single bond or a divalent alkylene group having 1 to 10 carbon atom(s) or arylalkylene group having 6 to 25 carbon atoms; m1 represents an integer of 1 to 4; m2 represents an integer of 1 to 5; o represents a number satisfying $0 \leq o \leq 4-m1$; p represents a number satisfying $0 \leq p \leq 5-m2$; and t represents an integer of 1 to 4.

Examples of the compound represented by Formula (b1-3) include the following compounds.

[Chemical Formula 8]

(b1-3-1)
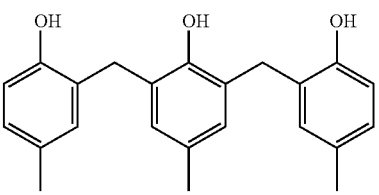

(b1-3-2)
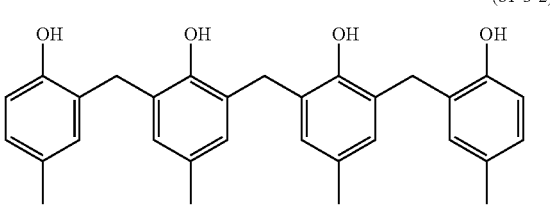

-continued (b1-3-3)

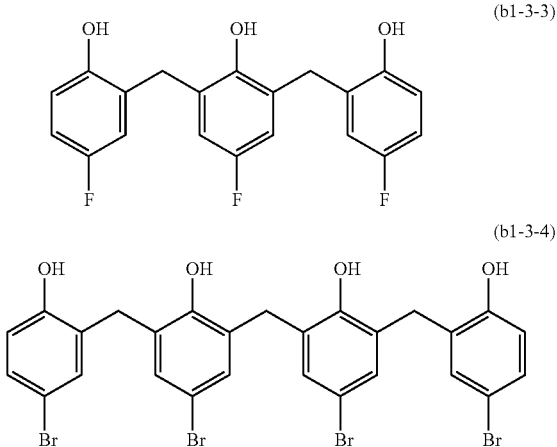

(b1-3-4)

In addition, examples of the polynuclear phenol may also include the following cyclic compounds.

[Chemical Formula 9]

(b1-3-5)

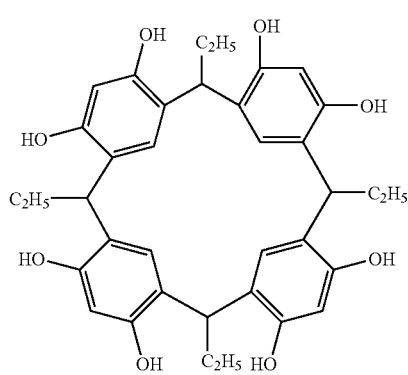

(b1-3-6)

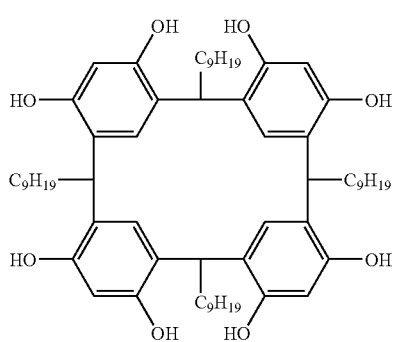

In the present invention, the polynuclear phenol (b) can be used in a ratio as the content thereof in the solid content of the resist underlayer film forming composition of 0.01 to 40% by mass, preferably 0.05 to 25% by mass.

The compound (c) having at least two vinylether groups used in the present invention is a compound represented by Formula (c1).

[Chemical Formula 10]

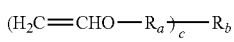

Formula (c1)

In Formula (c1), $R_a$ represents a divalent organic group selected from a group consisting of an alkyl group having 1 to 10 carbon atom(s), an aryl group having 6 to 18 carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms and an aryloxyalkyl group having 2 to 10 carbon atoms; $R_b$ represents a divalent to tetravalent organic group derived from an alkyl group having 1 to 10 carbon atom(s) or an aryl group having 6 to 18 carbon atoms; and c represents an integer of 2 to 4. For an alkyl group, an aryl group, an arylalkyl group, an alkylcarbonyl group, an alkylcarbonyloxy group, an alkylcarbonylamino group or an aryloxyalkyl group in Formula (c1), the groups exemplified in Formula (b1-2) can be utilized.

The compound (c1) having at least two vinylether groups is preferably a compound having 2 to 20, 3 to 10, or 3 to 6 vinylether groups.

Examples of the compound (c1) having at least two vinylether groups can include bis(4-(vinyloxymethyl)cyclohexylmethyl)glutarate, tri(ethylene glycol) divinyl ether, divinyl adipate ester, diethylene glycol divinyl ether, tris(4-vinyloxy) butyltrimellitate, bis(4-(vinyloxy)butyl)terephthalate, bis(4-(vinyloxy) butylisophthalate and cyclohexane dimethanol divinyl ether. These compounds may be used individually or in combination of two or more types thereof.

The content of the compound (c) having at least two vinylether groups is 0.01 to 60% by mass, for example 0.1 to 50% by mass, for example 0.1 to 40% by mass in the solid content of the resist underlayer film forming composition.

The resist underlayer film forming composition of the present invention contains a photoacid generator (d). As the photoacid generator (d), there can be mentioned a compound generating an acid by irradiation of light used for the exposure. Examples of the photoacid generator include photoacid generators such as diazomethane compounds, onium salt compounds, sulfoninaide compounds, nitrobenzyl compounds, benzoin tosylate compounds, halogen-containing triazine compounds and cyano group-containing oxime sulfonate compounds. Among them, a photoacid generator of onium salt compounds is preferred.

Specific examples of the onium salt compound include: iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl) iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate and triphenylsulfonium trifluoromethanesulfonate.

Specific examples of the sulfonimide compound include N-(trifluoromethanesulfonyloxy)succinimide, N-(nonafluoro-n-butanesulfonyloxy) succinimide, N-(camphorsulfonyloxy)succinimide and N-(trifluoromethanesulfonyloxy) naphthalimide.

The content of the photoacid generator (d) is 0.01 to 15% by mass, for example 0.1 to 10% by mass in the solid content of the resist underlayer film forming composition. When the used ratio of the photoacid generator (d) is less than 0.01% by mass, the ratio of generated acid becomes small and as the result, since the solubility of the exposed part in the alkaline developer is lowered, a residue may remain after the development. On the other hand, when the used ratio is more than 15% by mass, the preservation stability of the resist underlayer film forming composition may be lowered, which may influence the shape of the photoresist as the result.

The resist underlayer film forming composition of the present invention may contain absorptive compounds.

The absorptive compound is not particularly limited so long as it is a compound having absorption at an exposure wavelength used. As the absorptive compound, compounds having an aromatic ring structure such as an anthracene ring, a naphthalene ring, a benzene ring, a quinoline ring and a triazine ring are preferably used. In addition, from the viewpoint of not inhibiting the solubility of the resist underlayer film in an alkaline developer, compounds having a phenolic hydroxyl group, a carboxyl group, a hydroxyl group or a sulfonic acid group are preferred.

Examples of an absorptive compound largely absorbing light having a wavelength of 248 nm include anthracene carboxylic acid, hydroxymethyl anthracene and 3,7-dihydroxy-2-naphthoic acid.

The absorptive compound may be used individually or in combination of two or more types thereof. When the absorptive compound is used, the content thereof is for example 1 to 300 parts by mass, for example 1 to 200 parts by mass, for example 3 to 100 parts by mass, for example 5 to 50 parts by mass, relative to 100 parts by mass of the alkali-soluble resin (a). When the amount of the absorptive compound is more than 300 parts by mass, the solubility of the antireflective film in the alkaline developer may be lowered and the antireflective film may cause intermixing with the photoresist.

When the absorptive compound is used, by varying the type and the content thereof, the attenuation coefficient (k value) and the refractive index (n value) of the antireflective film can be controlled.

The resist underlayer film forming composition of the present invention may contain amine compounds. By adding amine compounds, the sensitivity of the resist underlayer film during the exposure can be controlled. In other words, amine is reacted with an acid generated from a photoacid generator during the exposure and the sensitivity of the resist underlayer film can be lowered. In addition, the diffusion of the acid generated from the photoacid generator (d) in an exposed part of the resist underlayer film to an unexposed part of the antireflective film can be suppressed.

The amine compound is not particularly limited and examples thereof can include: tertiary amines such as triethanolamine, tributanolamine, trimethylamine, triethylamine, tri-n-propylamine, triisopropylamine, tri-n-butylamine, tri-tert-butylamine and diazabicyclooctane; and aromatic amines such as pyridine and 4-dimethylaminopyridine. Further, examples thereof also include primary amines such as benzylamine and n-butylamine, and secondary amines such as diethylamine and di-n-butylamine.

The amine compound may be used individually or in combination of two or more types thereof. When the amine compound is used, the content thereof is for example 0.001 to 5 parts by mass, for example 0.01 to 1 part by mass, for example 0.1 to 0.5 parts by mass, relative to 100 parts by mass of the alkali-soluble resin. When the content of the amine compound is larger than 5 parts by mass, the sensitivity may be lowered excessively.

The resist underlayer film forming composition of the present invention may contain a surfactant. Examples of the surfactant include: nonionic surfactants, for example polyoxyethylene alkyl ethers such as polyoxyethylene lauryl ether, polyoxyethylene stearyl ether, polyoxyethylene cetyl ether and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-based surfactants, for example EFTOP EF301, EF303 and EF352 (manufactured by Mitsubishi Materials Electronic Chemicals Co., Ltd.), MEGAFAC F171 and F173 (manufactured by DIC Corporation), Fluorad FC430 and FC431 (manufactured by Sumitomo 3M Limited), Asahi Guard AG710 and Surfron S-382, SC101, SC102, SC103, SC104, SC105 and SC106 (manufactured by Asahi Glass Co., Ltd.); and Organosiloxane polymer KP341 (manufactured by Shin-Etsu Chemical Co., Ltd.). The blended amount of these surfactants are generally 0.2% by mass or less, preferably 0.1% by mass or less, based on the mass of the total components of the resist underlayer film forming composition of the present invention. These surfactants can be added individually or in combination of two or more types thereof.

The resist underlayer film forming composition of the present invention may contain, as necessary, a rheology controlling agent, an adhesion assistant, etc.

The resist underlayer film forming composition of the present invention can be prepared by dissolving each of the above components in an appropriate solvent and is used in a homogeneous solution state.

Examples of such a solvent, which can be used include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetoamide and N-methylpyrrolidone. These solvents may be used individually or in combination of two or more types thereof. Further, these solvents may be used by blending a high-boiling point solvent such as propylene glycol monobutyl ether and propylene glycol monobutyl ether acetate.

The prepared solution of resist underlayer film forming composition is preferably used after filtering the solution using a filter having a pore diameter of around 0.2 μm, etc. The thus prepared solution of resist underlayer film forming composition is excellent also in storage stability at room temperature for a long period.

Hereinafter, the use of the resist underlayer film forming composition of the present invention is described.

The resist underlayer film is formed by coating a substrate (for example, a silicon/silicon dioxide coated semiconductor substrate, a silicon nitride substrate, a glass substrate, an ITO substrate, etc.) with the resist underlayer film forming composition of the present invention by an appropriate coating method such as a spinner, a coater etc. and then by calcining the composition. The calcining conditions are appropriately selected from calcining temperatures of 80° C. to 250° C. and calcining times of 0.3 minutes to 60 minutes. Preferably, the calcining temperature is 130° C. to 250° C. and the calcining time is 0.5 to 5 minutes. Here, the resist underlayer film has a film thickness of, for example 0.01 to 3.0 µm, or for example 0.03 to 1.0 µm, for example 0.05 to 0.5 µm.

The resist underlayer film formed from the resist underlayer film forming composition of the present invention becomes a strong film by crosslinking a vinylether compound according to a calcining condition during the formation thereof. Then, the solubility of the resist underlayer film becomes lowered in an organic solvent generally used in a photoresist solution applied thereon. Examples of the organic solvent include ethylene glycol monomethyl ether, ethylcellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate. Therefore, the resist underlayer film formed from the resist underlayer film forming composition of the present invention causes no intermixing with the photoresist. When the calcining temperature is lower than a temperature in the above range, the crosslinkage becomes unsatisfactory and then, the intermixing with the photoresist may be caused. On the other hand, when the calcining temperature is too high, the crosslinkage is broken and then the intermixing with the photoresist may be caused.

Next, on the resist underlayer film, a photoresist layer is formed. The formation of the photoresist layer can be performed by a general method, that is, by applying a photoresist solution on a resist underlayer film and by calcining the resultant film.

The photoresist applied and formed on the resist underlayer film of the present invention is not particularly limited so long as it is exposed to exposure light to exhibit a positive-type behavior. Examples of the photoresist include: a positive-type photoresist containing a novolac resin and 1,2-naphthoquinonediazide sulfonate ester; a chemical amplification type photoresist containing a binder having a group elevating an alkali dissolving rate by being decomposed by an acid, and a photoacid generator; a chemical amplification type photoresist containing a low molecule compound elevating an alkali dissolving rate of a photoresist by being decomposed by an acid, an alkali-soluble binder and a photoacid generator; and a chemical amplification type photoresist containing a binder having a group elevating an alkali dissolving rate by being decomposed by an acid, a low molecule compound elevating an alkali dissolving rate of a photoresist by being decomposed by an acid and a photoacid generator. Examples thereof include trade name: APEX-E manufactured by Shipley Company L.L.C., trade name: PAR710 manufactured by Sumitomo Chemical Co., Ltd. and trade name: SEPR430 manufactured by Shin-Etsu Chemical Co., Ltd.

A semiconductor device is produced by a production method including: applying a resist underlayer film forming composition on a semiconductor substrate and calcining the composition to form a resist underlayer film; forming a photoresist layer on the resist underlayer film; performing the exposure of the semiconductor substrate coated with the resist underlayer film and the photoresist layer using a photomask; and developing the semiconductor substrate after the exposure.

The exposure is performed through a predetermined mask. For the exposure, a KrF excimer laser (wavelength: 248 nm), an ArF excimer laser (wavelength: 193 nm), an F2 excimer laser (wavelength: 157 nm), and the like can be used. After the exposure, as necessary, post exposure bake is performed. The conditions of the post exposure bake are appropriately selected from heating temperatures of 80° C. to 150° C. and heating times of 0.3 minutes to 60 minutes.

A semiconductor device is produced by exposing a semiconductor substrate coated with a resist underlayer film and a photoresist layer using a photomask and by developing the substrate thereafter.

The resist underlayer film formed from the resist underlayer film forming composition of the present invention is rendered soluble in an alkaline developer by an action of an acid generated during the exposure from a photoacid generator contained in the resist underlayer film.

Accordingly, an exposed part of the semiconductor substrate coated with the resist underlayer film and the photoresist layer exhibits alkali-solubility in the developer.

Next, after the exposure is performed, the development is performed using an alkaline developer. By this treatment, the photoresist in the exposed part and the resist underlayer film as an underlayer part of the photoresist are removed at the same time.

Examples of the alkaline developer can include alkaline aqueous solutions, for example, aqueous solutions of alkali metal hydroxides such as potassium hydroxide and sodium hydroxide, aqueous solutions of quaternary ammonium hydroxides such as tetramethylammonium hydroxide, tetraethylammonium hydroxide and choline, and solutions of amines such as ethanolamine, propylamine and ethylenediamine. Further, to these developers, a surfactant or the like may be added.

The conditions for the development are appropriately selected from temperatures of 5° C. to 50° C. and times of 10 to 300 seconds. The resist underlayer film formed from the resist underlayer film forming composition of the present invention can be easily developed at room temperature using a 2.38% by mass tetramethylammonium hydroxide aqueous solution generally used in the development of a photoresist.

The resist underlayer film of the present invention can be used also as a layer for preventing an interaction between the substrate and the photoresist, a layer having a function of preventing an adverse action of materials used in the photoresist or substances generated during the exposure of the photoresist against the semiconductor substrate, a layer having a function of preventing diffusion of substances generated from the semiconductor substrate when heated and calcined to the upper layer photoresist, and a barrier layer for reducing a poisoning effect of a dielectric layer formed on a semiconductor substrate against the photoresist.

Hereinafter, the resist underlayer film prepared from the resist underlayer film forming composition of the present invention will be described specifically as an antireflective film prepared from an antireflective film forming composition referring to Examples, which should not be construed as limiting the scope of the present invention.

EXAMPLES

Synthesis Example 1

(Synthesis of Alkali-Soluble Resin (a-1))

To 186.1 g of propylene glycol monomethyl ether, 13.00 g of methyl methacrylate, 621 g of methacrylic acid, 11.27 g of 2-hydroxyethyl acrylate and 2.37 g of N,N'-azobisisobutylonitrile were added and the resultant mixture was reacted at 70° C. for 20 hours to obtain a solution [a-1] containing an alkali-soluble resin (a-1). The weight average molecular mass (converted into that of standard polystyrene) of the obtained polymer was found to be 18,400. The solution [a-1] was applied on a semiconductor substrate (silicon wafer) using a spinner and thereafter, the resultant coating was calcined at a temperature of 180° C. for 60 seconds using a hot plate to form an antireflective film having a film thickness of 45 nm. This antireflective film was measured using a spectro-elipsometer and as the result, the refractive index (n value) and the attenuation coefficient (k value) at a wavelength of 193 nm were found to be 1.64 and 0.00 respectively and the refractive index (n value) and the attenuation coefficient (k value) at a wavelength of 248 nm were found to be 1.55 and 0.00 respectively. When the total number of all repeating units of the following alkali-soluble resin (a-1) was assumed to be 1.0, p1, p2 and p3 were 0.45, 0.25 and 0.30 respectively.

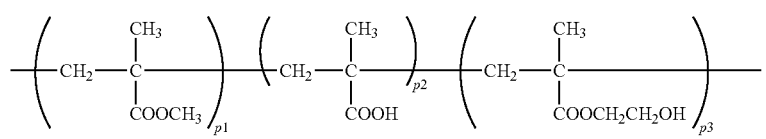

Synthesis Example 2

(Synthesis of Alkali-Soluble Resin (a-2))

4,4'-(hexafluoroisopropylidene) diphthalic dianhydride (0.1 mol, 42.02 g), 3,5-diamino-benzoic acid (0.1 mol, 12.79 g) and bis(4-aminophenylsulfone) (0.1 mol, 5.22 g) were reacted in 340.19 g of propylene glycol monomethyl ether at 40° C. for 24 hours. Subsequently, phthalic anhydride (0.1 mol, 3.11 g) and 17.64 g of propylene glycol monomethyl ether were added to the reaction mixture and the reaction was effected at room temperature for 5 hours to obtain a solution containing polyamic acid. To the obtained polyamic acid, N-methylpyrrolidone was added to dilute the solution to a concentration of polyamic acid of 8.0% by mass and thereafter, acetic anhydride and pyridine were added to the reaction mixture to effect a dehydration-ring closure reaction at 40° C. for 2 hours. This solution was injected into methanol and the resultant precipitation was filtered and dried to obtain the following polyimide (a-2). The polyimide (a-2) was analyzed by a GPC analysis and the weight average molecular mass Mw and the number average molecular mass Mn were found to be 7,100 and 4,800 (each converted into that of standard polystyrene) respectively. When the total number of all repeating units of the polyimide (a-2) was assumed to be 1.0, p1 and p2 were 0.20 and 0.80 respectively.

[Chemical Formula 12]

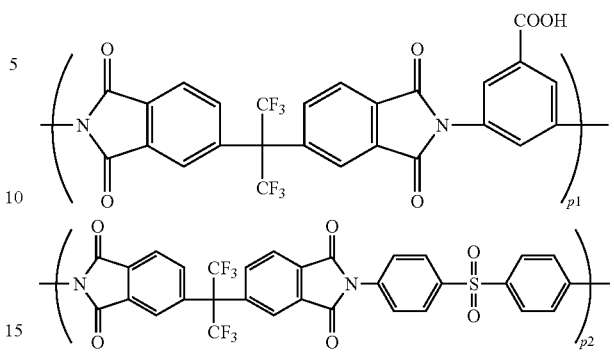

Synthesis Example 3

(Synthesis of Alkali-Soluble Resin (a-3))

To 157.0 g of propylene glycol monomethyl ether, 12.00 g of 3-hydroxyadamantyl methacrylate, 6.27 g of methacrylic acid, 8.06 g of p-tert-butoxystyrene and 1.39 g of N,N'-azobisisobutylonitrile were added and the resultant mixture was reacted at 70° C. for 20 hours to obtain a solution [a-3] containing an alkali-soluble resin (a-3). The weight average molecular mass (converted into that of standard polystyrene) of the obtained polymer was found to be 15,500. When the total number of all repeating units of the following alkali-soluble resin (a-3) was assumed to be 1.0, p1, p2 and p3 were 0.30, 0.43 and 0.27 respectively,

[Chemical Formula 13]

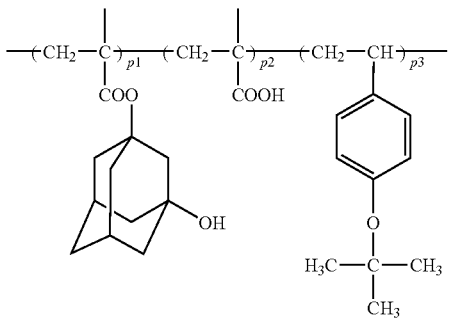

Synthesis Example 4

(Synthesis of Absorptive Compound)

38.0 g of 3,7-dihydroxy-2-naphthoic acid, 20 g of tris(2,3-epoxypropyl) isocyanurate, 1.104 g of benzyltriethylammonium chloride were added to 136 g of cyclohexanone and the resultant mixture was reacted at 130° C. for 24 hours to obtain a solution [e] containing an absorptive compound represented by Formula (e).

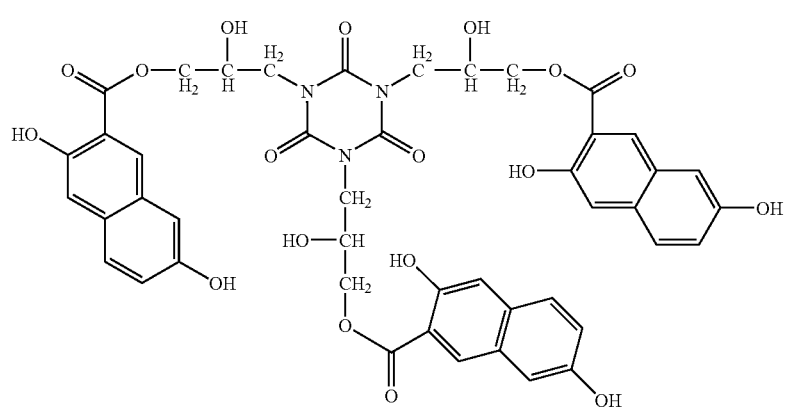

(Preparation of Compound Having at Least Two Vinylether Groups)

As compounds (c1-1) and (c1-2) having at least two vinylether groups, 1,3,5-tris(4-vinyloxy) butyltrimellitate:

[Chemical Formula 15]

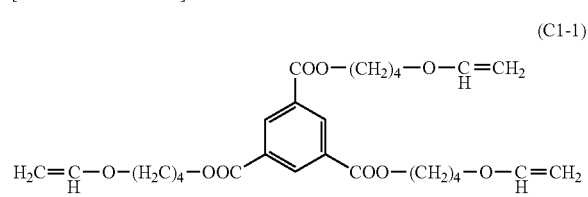

(C1-1)

and 1,2,4-tris(4-vinyloxy)butyltrimellitate:

[Chemical Formula 16]

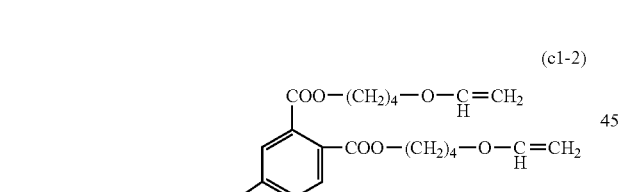

(c1-2)

were prepared respectively.

(Preparation of Photoacid Generator)

As photoacid generators, triphenylsulfonium trifluoromethanesulfonate (d-1):

[Chemical Formula 17]

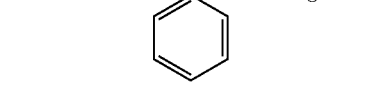

(d-1)

and triphenylsulfonium nonafluorobutanesulfonate (d-2):

[Chemical Formula 18]

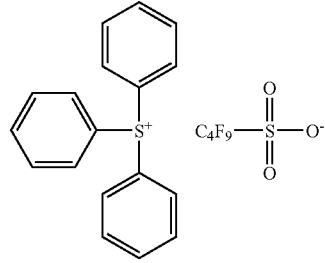

(d-2)

were prepared.

(Preparation of Crosslinkable Compound)

As an epoxy-based crosslinkable compound used in Comparative Examples, 4,4'-methylenebis(N,N-diglycidylaniline) (f-1):

[Chemical Formula 19]

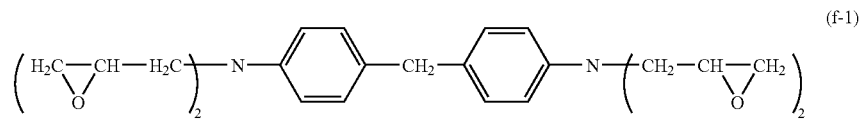

(f-1)

was prepared.

Example 1

(Preparation of Antireflective Film Forming Composition (Resist Underlayer Film Forming Composition))

To 5.0 g of the solution [a-1], 0.33 g of 1,2,4-tris(4-vinyloxy)butyltrimellitate (c1-2), 0.12 g of 4,4-(1-(1-(4-hydroxyphenyl)-1-methylethyl)phenyl)ethylidene) bisphenol (b1-1-2), 0.03 g of triphenylsulfonium trifluoromethanesulfonate (d-1), 0.001 g of triethanolamine, 11.0 g of propylene glycol monomethyl ether and 3.82 g of propylene glycol monomethyl ether acetate were added and the resultant mixture was stirred at room temperature for 30 minutes to prepare a solution [1] of an antireflective film forming composition.

(Evaluation of Antireflective Film Forming Composition (Resist Underlayer Film Forming Composition))

The solution [1] of an antireflective film forming composition was applied on a semiconductor substrate (silicon wafer) using a spinner and thereafter, the resultant coating was calcined at a temperature of 180° C. for 60 seconds using a hot plate to form an antireflective film having a film thickness of 80 nm. The obtained antireflective film was insoluble in ethyl lactate, propylene glycol monomethyl ether, propylene glycol monomethyl ether acetate and a 2.38% by mass tetramethylammonium hydroxide aqueous solution (trade name: NMD-3; manufactured by Tokyo Ohka Kogyo Co., Ltd.). This antireflective film was measured using a spectro-elipsometer and as the result, the refractive index (n value) and the attenuation coefficient (k value) at a wavelength of 193 nm were found to be 1.59 and 0.20 respectively and the refractive index (n value) and the attenuation coefficient (k value) at a wavelength of 248 nm were found to be 1.66 and 0.04 respectively.

The solution [1] of an antireflective film forming composition was applied on a silicon wafer using a spinner and thereafter, the resultant coating was calcined at a temperature of 180° C. for 60 seconds using a hot plate to form an antireflective film having a film thickness of 80 nm. On the obtained antireflective film, a positive-type photoresist for ArF was formed and the formed photoresist was exposed to an ArF excimer laser (wavelength: 193 nm) through a mask. A post exposure bake was performed at a temperature of 130° C. for 90 seconds and thereafter, a puddle development was performed using as an alkaline developer, a 2.38% by mass tetratnethylammonium hydroxide aqueous solution (trade name: NMD-3; manufactured by Tokyo Ohka Kogyo Co., Ltd.) for 60 seconds. In the exposed part, the antireflective film was dissolved together with the photoresist and no residual film was found.

Example 2

(Preparation of Antireflective Film Forming Composition (Resist Underlayer Film Forming Composition))

To 4.0 g of the solution [a-1], 0.25 g of 1,2,4-tris(4-vinyloxy)butyltrimellitate (c1-2), 0.09 g of 4,4-O-(1-(4-hydroxyphenyl)-1-methylethyl)phenyl)ethylidene) bisphenol (b1-1-2), 0.37 g of the absorptive compound-containing solution [e], 0.02 g of triphenylsulfonium trifluoromethanesulfonate (d-1), 0.003 g of triethanolamine, 17.8 g of propylene glycol monomethyl ether and 2.35 g of propylene glycol monomethyl ether acetate were added and the resultant mixture was stirred at room temperature for 30 minutes to prepare a solution [2] of an antireflective film forming composition.

(Evaluation of Antireflective Film Forming Composition (Resist Underlayer Film Forming Composition))

The solution [2] of an antireflective film forming composition was applied on a semiconductor substrate (silicon wafer) using a spinner and thereafter, the resultant coating was calcined at a temperature of 180° C. for 60 seconds using a hot plate to form an antireflective film having a film thickness of 50 nm. The obtained antireflective film was insoluble in ethyl lactate, propylene glycol monomethyl ether, propylene glycol monomethyl ether acetate and a 2.38% by mass tetramethylammonium hydroxide aqueous solution (trade name: NMD-3; manufactured by Tokyo Ohka Kogyo Co., Ltd.). This antireflective film was measured using a spectro-elipsometer and as the result, the refractive index (n value) and the attenuation coefficient (k value) at a wavelength of 193 nm were found to be 1.59 and 0.20 respectively and the refractive index (n value) and the attenuation coefficient (k value) at a wavelength of 248 ran were found to be 1.62 and 0.12 respectively.

The solution [2] of an antireflective film forming composition was applied on a silicon wafer using a spinner and thereafter, the resultant coating was calcined at a temperature of 180° C. for 60 seconds using a hot plate to form an antireflective film having a film thickness of 80 nm. On the obtained antireflective film, a positive-type photoresist for KrF was formed and the formed photoresist was exposed to a KrF excimer laser (wavelength: 248 nm) through the same mask as that used in Example 1. A post exposure bake was performed at a temperature of 110° C. for 90 seconds and thereafter, a puddle development was performed using as an alkaline developer, a 2.38% by mass tetramethylammonium hydroxide aqueous solution (trade name: NMD-3; manufactured by Tokyo Ohka Kogyo Co., Ltd.) for 60 seconds. In the exposed part, the antireflective film was dissolved together with the photoresist and no residual film was found.

Example 3

(Preparation of Antireflective Film Forming Composition (Resist Underlayer Film Forming Composition))

To 2.99 g of the alkali-soluble compound (a-2), 120 g of 1,3,5-tris(4-vinyloxy)butyltrimellitate (c1-1), 0.45 g of 1,1,1-tris(4-hydroxyphenyl)ethane (b1-1-20), 0.12 g of triphenylsulfonium trifluoromethanesulfonate (d-1), 0.012 g of triethanolamine and 100.9 g of ethyl lactate were added and the resultant mixture was stirred at room temperature for 30 minutes to prepare a solution [3] of an antireflective film forming composition.

(Evaluation of Antireflective Film Forming Composition (Resist Underlayer Film Forming Composition))

The solution [3] of an antireflective film forming composition was applied on a silicon wafer using a spinner and thereafter, the resultant coating was calcined at a temperature of 160° C. for 60 seconds using a hot plate to form an antireflective film having a film thickness of 70 nm. The obtained antireflective film was insoluble in ethyl lactate and propylene glycol monomethyl ether acetate. This antireflective film was measured using a spectro-elipsometer and as the result, the refractive index (n value) and the attenuation coefficient (k value) at a wavelength of 193 nm were found to be 1.47 and 0.50 respectively and the refractive index (n value) and the attenuation coefficient (k value) at a wavelength of 248 nm were found to be 1.83 and 0.37 respectively.

On the antireflective film, a positive-type photoresist film for ArF was formed and the formed photoresist film was exposed to an ArF excimer laser (wavelength: 193 nm)

through the same mask as that used in Example 1. A post exposure bake was performed at 130° C. for 90 seconds and thereafter, a puddle development was performed using as an alkaline developer, a 2.38% by mass tetramethylammonium hydroxide aqueous solution (trade name: NMD-3; manufactured by Tokyo Ohka Kogyo Co., Ltd.) for 60 seconds. In the exposed part, the antireflective film was dissolved together with the photoresist and no residual film was found.

Example 4

(Preparation of Antireflective Film Forming Composition (Resist Underlayer Film Forming Composition))

To 6.0 g of the solution [a-3], 0.24 g of 1,3,5-tris(4-vinyloxy)butyltrimellitate (c1-1), 0.05 g of 4,4-(1-(1-(4-hydroxyphenyl)-1-methylethyl)phenyl)ethylidene) bisphenol (b1-1-2), 0.04 g of triphenylsulfonium nonafluorbutanesulfonate (d-2), 0.003 g of triethanolamine, 11.0 g of propylene glycol monomethyl ether and 4.02 g of propylene glycol monomethyl ether acetate were added and the resultant mixture was stirred at room temperature for 30 minutes to prepare a solution [4] of an antireflective film forming composition.

(Evaluation of Antireflective Film Forming Composition (Resist Underlayer Film Forming Composition))

The solution [4] of an antireflective film forming composition was applied on a semiconductor substrate (silicon wafer) using a spinner and thereafter, the resultant coating was calcined at a temperature of 180° C. for 60 seconds using a hot plate to form an antireflective film having a film thickness of 80 nm. The obtained antireflective film was insoluble in ethyl lactate, propylene glycol monomethyl ether, propylene glycol monomethyl ether acetate and a 2.38% by mass tetramethylammonium hydroxide aqueous solution (trade name: NMD-3; manufactured by Tokyo Ohka Kogyo Co., Ltd.). This antireflective film was measured using a specto-elipsometer and as the result, the refractive index (n value) and the attenuation coefficient (k value) at a wavelength of 193 nm were found to be 1.60 and 0.28 respectively, and the refractive index (n value) and the attenuation coefficient (k value) at a wavelength of 248 nm were found to be 1.67 and 0.03 respectively.

The solution [4] of an antireflective film forming composition was applied on a silicon wafer using a spinner and thereafter, the resultant coating was calcined at a temperature of 180° C. for 60 seconds using a hot plate to form an antireflective film having a film thickness of 80 nm. On the obtained antireflective film, a positive-type photoresist for ArF was formed and the formed photoresist was exposed to an ArF excimer laser (wavelength: 193 nm) through the same mask as that used in Example 1. A post exposure bake was performed at 130° C. for 90 seconds and thereafter, a puddle development was performed using as an alkaline developer, a 2.38% by mass tetramethylammonium hydroxide aqueous solution (trade name: NMD-3; manufactured by Tokyo Ohka Kogyo Co., Ltd.) for 60 seconds. In the exposed part, the antireflective film was dissolved together with the photoresist and no residual film was found.

Comparative Example 1

(Preparation of Antireflective Film Forming Composition (Resist Underlayer Film Forming Composition))

To 5.0 g of the solution [a-1], 0.33 g of 1,3,5-tris(4-vinyloxy)butyltrimellitate (c1-1), 0.03 g of triphenylsulfonium trifluoromethanesulfonate (d-1), 0.001 g of triethanolamine, 11.0 g of propylene glycol monomethyl ether and 3.82 g of propylene glycol monomethyl ether acetate were added and the resultant mixture was stirred at room temperature for 30 minutes to prepare a solution [5] of an antireflective film forming composition.

(Evaluation of Antireflective Film Forming Composition (Resist Underlayer Film Forming Composition))

The solution [5] of an antireflective film forming composition was applied on a semiconductor substrate (silicon wafer) using a spinner and thereafter, the resultant coating was calcined at a temperature of 180° C. for 60 seconds using a hot plate to form an antireflective film having a film thickness of 80 nm. The obtained antireflective film was insoluble in ethyl lactate, propylene glycol monomethyl ether, propylene glycol monomethyl ether acetate and a 238% by mass tetramethylammonium hydroxide aqueous solution (trade name: NMD-3; manufactured by Tokyo Ohka Kogyo Co., Ltd.). This antireflective film was measured using a spectro-elipsometer and as the result, the refractive index (n value) and the attenuation coefficient (k value) at a wavelength of 193 nm were found to be 1.58 and 0.04 respectively, and the refractive index (n value) and the attenuation coefficient (k value) at a wavelength of 248 nm were found to be 1.64 and 0.00 respectively.

The solution [5] of an antireflective film forming composition was applied on a silicon wafer using a spinner and thereafter, the resultant coating was calcined at a temperature of 180° C. for 60 seconds using a hot plate to form an antireflective film having a film thickness of 80 nm. On the obtained antireflective film, a positive-type photoresist for ArF was formed and the formed photoresist was exposed to an ArF excimer laser (wavelength: 193 nm) through the same mask as that used in Example 1. A post exposure bake was performed at a temperature of 130° C. for 90 seconds and thereafter, a puddle development was performed using as an alkaline developer, a 2.38% by mass tetramethylammonium hydroxide aqueous solution (trade name: NMD-3; manufactured by Tokyo Ohka Kogyo Co., Ltd.) for 60 seconds. As a result, in a pattern bottom part of the exposed part, a development residue in a large amount was observed. In addition, since this antireflective film has an attenuation coefficient (k value) smaller than that of the antireflective film in Example 1, a standing wave was remarkably observed, so that the verticality of the photoresist pattern sidewall was largely impaired.

Comparative Example 2

(Preparation of Antireflective Film Forming Composition (Resist Underlayer Film Forming Composition))

To 2.99 g of the alkali-soluble resin (a-2), 0.30 g of 4,4'-methylenebis(N,N-diglyeidylaniline) (f-1), 0.45 g of 1,1,1-tris(4-hydroxyphenyl)ethane (b1-1-2), 0.12 g of triphenylsulfonium trifluoromethanesulfonate (d-1), 0.012 g of triethanolamine and 100.9 g of ethyl lactate were added and the resultant mixture was stirred at room temperature for 30 minutes to prepare a solution [6] of an antireflective film forming composition.

(Evaluation of Antireflective Film Forming Composition (Resist Underlayer Film Forming Composition))

The solution [6] of an antireflective film forming composition was applied on a silicon wafer using a spinner and thereafter, the resultant coating was calcined at a temperature of 160° C. for 60 seconds using a hot plate to form an antireflective film having a film thickness of 70 nm. The obtained antireflective film was insoluble in ethyl lactate and propylene glycol monomethyl ether acetate. On the obtained antireflective film, a positive-type photoresist film for ArF was formed and the formed photoresist film was exposed to an ArF excimer laser (wavelength: 193 nm) through the same mask as that used in Example 1. A post exposure bake was performed at 130° C. for 90 seconds and thereafter, a puddle development was performed using as an alkaline developer, a 2.38% by mass tetramethylammonium hydroxide aqueous solution (trade name: NMD-3; manufactured by Tokyo Ohka Kogyo Co., Ltd.) for 60 seconds. As a result, the antireflective film formed from the solution [6] of an antireflective film forming composition was insoluble in NMD-3. In other words, the photoresist could be developed, however, the antireflective film existing as an underlayer of the photoresist could not be developed.

INDUSTRIAL APPLICABILITY

In the resist underlayer film forming composition of the present invention, bonds are formed between an alkali-soluble resin and a polynuclear phenol, and a vinylether compound. The bonds are broken by an acid generated from a photoacid generator during the exposure to generate a large number of carboxyl groups and phenols soluble in an alkali developer. Thus, since the resist underlayer film forming composition can generate a plurality of soluble groups per unit area, it can be effectively utilized for forming fine patterns in a production process of semiconductor devices.

The invention claimed is:
1. A method of manufacturing a semiconductor device, the method comprising:
    forming a resist underlayer film by using a resist underlayer film forming composition on a semiconductor substrate;
    forming a resist film on the resist underlayer film; and
    exposing the resist film to light and developing the resist film to form a resist pattern,
    wherein the resist underlayer film forming composition comprises:
        an alkali-soluble resin (a),
        a polynuclear phenol (b);
        a compound (c) having at least two vinylether groups, and
        a photoacid generator (d),
        wherein
            the alkali-soluble resin (a) is a polymer containing a unit structure having a carboxyl group in an amount from 0.05 to 0.80 when all repeating units contained in the alkali-soluble resin (a) are assumed to be 1.0;
            the unit structure containing a carboxyl group is derived from polymerization of acrylic acid or methacrylic acid, or is used in form of a carboxyl group substituted in an aromatic ring, and
            the polynuclear phenol (b) is a compound represented by Formula (b1-1):

Formula (b1-1)

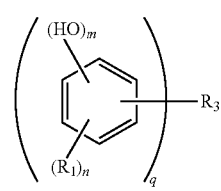

where each $R_1$ is a substituent for a hydrogen atom of a benzene ring and represents a group selected from a group consisting of a hydroxy group, a halogen atom, an alkyl group having 1 to 10 carbon atom, an aryl group having 6 to 18 carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 2 to 10 carbon atoms, an alkoxy group having 1 to 6 carbon atom and a combination of these substituents; $R_3$ represents a single bond or a divalent to tetravalent alkylene group having 1 to 10 carbon atom or arylalkylene group having 6 to 25 carbon atoms; m is an integer of 1 to 5; n represents an integer satisfying 0≤n≤5-m; and q represents an integer of 2 to 4,
a compound represented by Formula (b1-2):

Formula (b1-2)

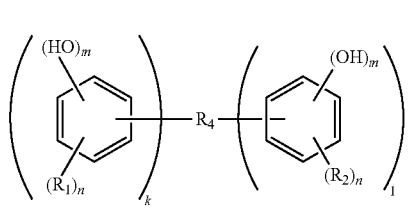

where $R_1$ and $R_2$ are the same as or different from each other and individually represent the same meaning as $R_1$ defined in Formula (b1-1); $R_4$ represents a single bond or a divalent to hexavalent alkylene group having 1 to 10 carbon atom or arylalkylene group having 6 to 25 carbon atoms; m represents an integer of 1 to 5; n represents an integer satisfying 0≤n≤5-m; and k and s individually represent an integer of 1 to 3,
a compound represented by Formula (b1-3):

Formula (b1-3)

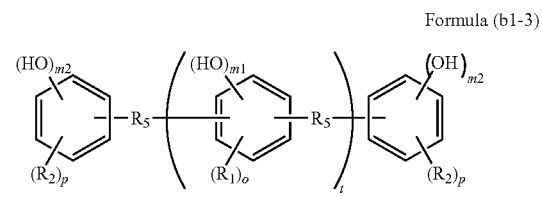

where $R_1$ and $R_2$ are the same as or different from each other and individually represent the same meaning as $R_1$ defined in Formula (b1-1); $R_5$ represents a single bond or a divalent alkylene group having 1 to 10 carbon atom or arylalkylene group having 6 to 25 carbon atoms; m1 represents an integer of 1 to 4; m2 represents an integer of 1 to 5; o is a number satisfying 0≤o≤4-m1; p is a number satisfying 0≤p≤5-m2; and t represents an integer of 1 to 4,
or a combination of these compounds, and
wherein a content of the alkali-soluble resin (a) in the solid content of the resist underlayer film forming composition is 49 to 90% by mass, a content of the polynuclear phenol (b) in the solid content of the resist underlayer film forming composition is 0.01 to 40% by mass, a content of the compound (c) having at least two vinylether groups in the solid content of the resist underlayer film forming composition is 0.1 to 40% by mass, and a content of the photoacid generator (d) in the solid content of the resist underlayer film forming composition is 0.1 to 10% by mass.

2. The method of manufacturing a semiconductor device according to claim 1, wherein the compound (c) having at least two vinylether groups is represented by Formula (c1):

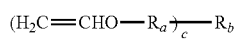

Formula (c1)

where $R_a$ represents a divalent organic group selected from a group consisting of an alkyl group having 1 to 10 carbon atom, an aryl group having 6 to 18 g carbon atoms, an arylalkyl group having 6 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms and an aryloxyalkyl group having 2 to 10 carbon atoms; $R_b$ represents a divalent to tetravalent organic group derived from an alkyl group having 1 to 10 carbon atom or an aryl group having 6 to 18 carbon atoms; and c represents an integer of 2 to 4.

3. The method of manufacturing a semiconductor device according to claim 1, wherein an exposed part of the resist underlayer film used exhibits alkali-solubility and an exposed part of the resist film and an exposed part of the resist underlayer film are removed at the same time by development using an alkaline developer to form the resist pattern on the semiconductor substrate.

4. The method of manufacturing a semiconductor device according to claim 1, wherein the alkali-soluble resin (a) has the carboxyl group in an amount from 0.10 to 0.60 when all repeating units contained in the alkali-soluble resin (a) are assumed to be 1.0.

5. The method of manufacturing a semiconductor device according to claim 1, wherein during forming a resist underlayer film, the alkali-soluble resin (a), the polynuclear phenol (b), and the compound (c) having at least two vinylether groups react to form an acetal bond, and during exposing the resist film to light and developing the resist film to form a resist pattern, the photoacid generator (d) generates an acid that breaks bonds between the alkali-soluble resin (a) and the compound (c) having at least two vinylether groups, and breaks bonds between the polynuclear phenol (b) and the compound (c) having at least two vinylether groups.

* * * * *